United States Patent
Ayyapureddi

(10) Patent No.: US 12,105,955 B2
(45) Date of Patent: Oct. 1, 2024

(54) MEMORY OPERATIONS ACROSS BANKS WITH MULTIPLE COLUMN ACCESS

(71) Applicant: Micron Technology, Inc., Boise, ID (US)

(72) Inventor: Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 17/722,084

(22) Filed: Apr. 15, 2022

(65) Prior Publication Data

US 2023/0333741 A1    Oct. 19, 2023

(51) Int. Cl.
   *G06F 3/06* (2006.01)

(52) U.S. Cl.
   CPC ............ *G06F 3/061* (2013.01); *G06F 3/0629* (2013.01); *G06F 3/0659* (2013.01); *G06F 3/0673* (2013.01)

(58) Field of Classification Search
   CPC ...... G06F 3/061; G06F 3/0629; G06F 3/0659; G06F 3/0673; G06F 12/0284; G11C 11/4076
   See application file for complete search history.

(56) References Cited

U.S. PATENT DOCUMENTS

| | | | | |
|---|---|---|---|---|
| 2013/0279251 | A1* | 10/2013 | Lee | G11C 16/0408 365/185.12 |
| 2014/0025873 | A1* | 1/2014 | Nguyen | G06F 3/0679 711/103 |
| 2014/0082263 | A1* | 3/2014 | Iwasa | G06F 3/0613 711/103 |

* cited by examiner

*Primary Examiner* — Larry T MacKall
(74) *Attorney, Agent, or Firm* — Holland & Hart LLP

(57) ABSTRACT

Methods, systems, and devices for memory operations across banks with multiple column access are described. Techniques are described for a memory system to use a same bank for first and second access operations of data associated with an access command. The data corresponding to the second access operation may be communicated after the data corresponding to the first access operation on the same data channels. Techniques are further described for including one or more additional access commands with the access command that use other banks. Techniques are further described for interleaving data sets communicated as a result of the access commands and for abutting data sets based on parameters obtained by the memory device.

28 Claims, 10 Drawing Sheets

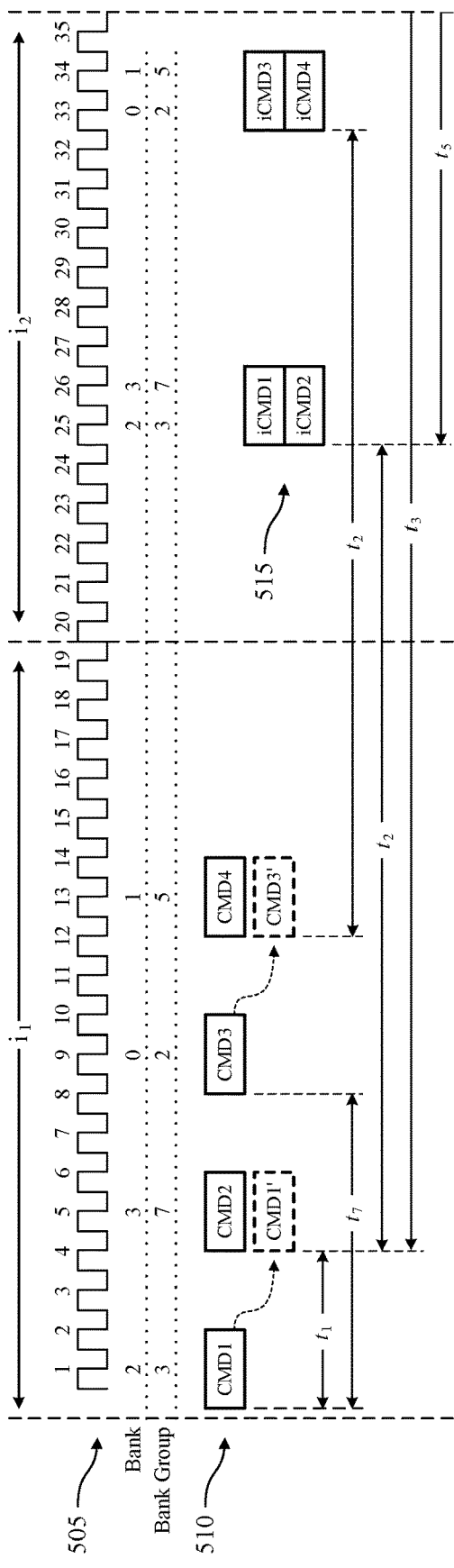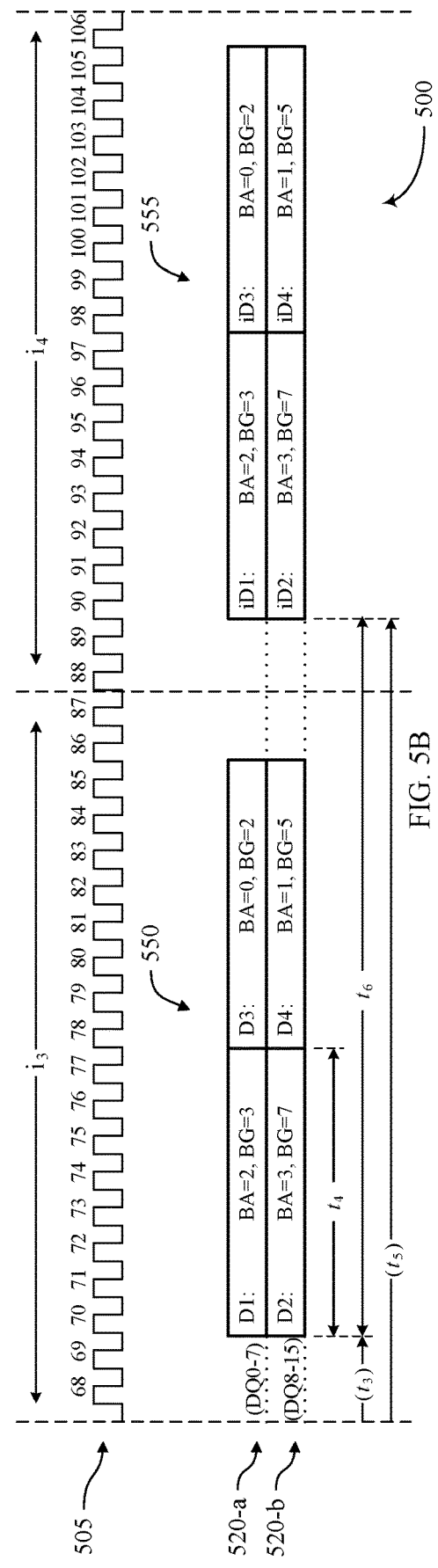
FIG. 5A
FIG. 5B

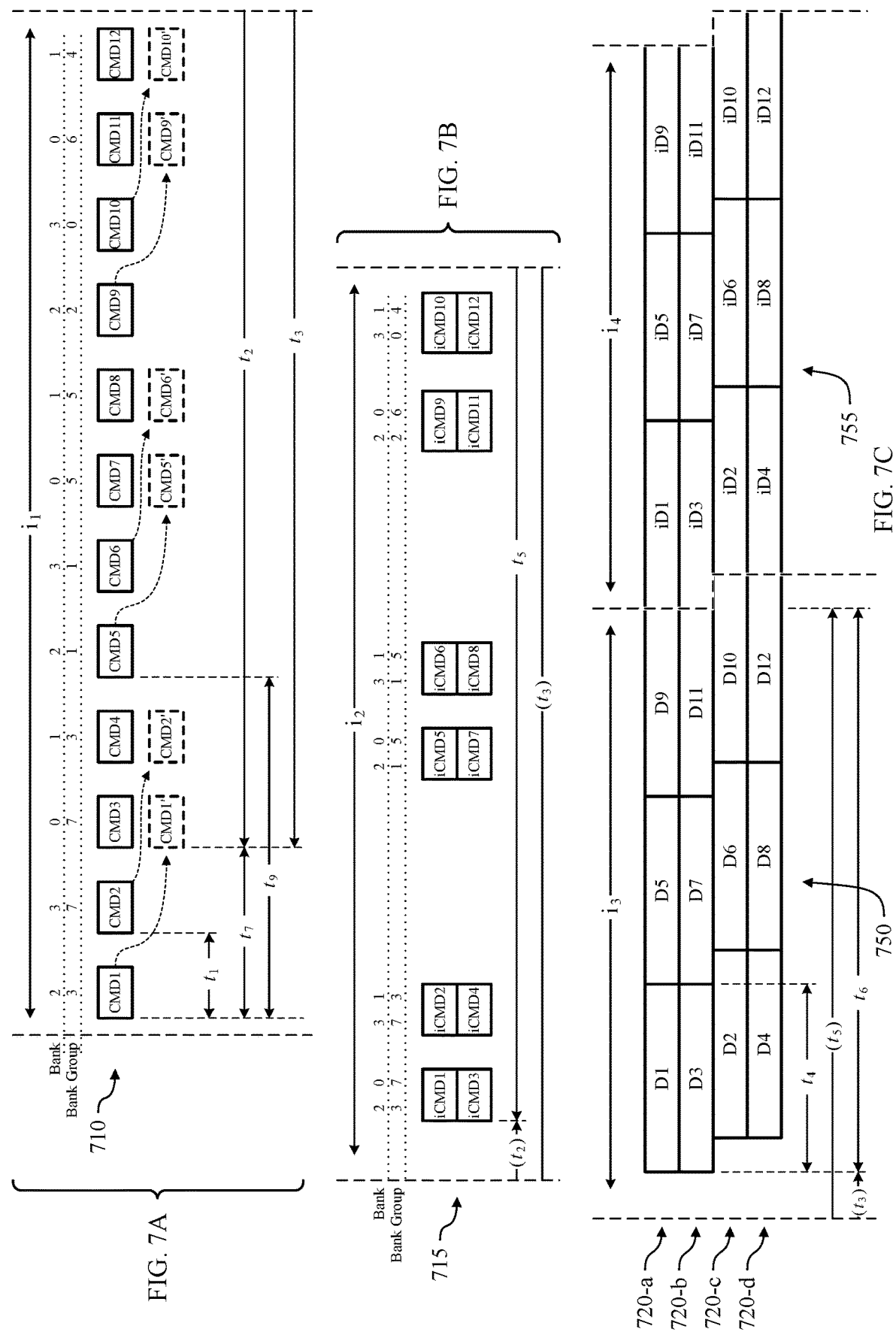

MEMORY OPERATIONS ACROSS BANKS WITH MULTIPLE COLUMN ACCESS

FIELD OF TECHNOLOGY

The following relates to one or more systems for memory, including memory operations across banks with multiple column access.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 5A-5B illustrate another example timing diagram that supports memory operations across banks with multiple column access in accordance with examples as disclosed herein.

FIG. 7A-7C illustrate another example timing diagram that supports memory operations across banks with multiple column access in accordance with examples as disclosed herein.

DETAILED DESCRIPTION

Memory devices may have configurable bus widths, while other operational parameters such as burst length may be consistent over the different bus widths. Thus, different bus widths may be associated with different total quantities of bits per burst. Further, the memory may have a certain quantity of data that is available for each column access. Where the total quantity of bits per burst is equal to or less than the quantity of data available for each column access, all or a subset of the data from a column access may be output for the burst without any additional timing overhead. However, where the total quantity of bits per burst is greater than the quantity of data available for each column access, a single access operation on a single bank may not supply enough data in response to an access command received from a host device.

Increasing the quantity of bits available for a single column access may add significant overhead because a large amount of circuitry may be needed that may be unused for the lower bus widths, which tend to be the largest share of how the devices are used. Because of this, memory devices may concurrently perform first and second access operations on separate banks to supply enough data in response to an access command. As a result, only half of the banks or bank groups of a memory may be addressable, corresponding to a first number of banks/bank groups. The rest of the memory may be used to automatically communicate data on the second portion of data channels data corresponding to the second access operations on a second number of banks. Thus, only half the number of banks/bank groups may be available, which may limit the flexibility of access operations by the host, since a longer time may be needed between accesses to the same bank than to different banks.

Techniques are described for a memory system to use a same bank for first and second access operations of data associated with an access command. The data corresponding to the second access operation may be communicated after and on the same data channels as the data corresponding to the first access operation. This may allow all of the banks and bank groups to be accessible, increasing the flexibility of access operations.

Features of the disclosure are initially described in the context of systems and dies as described with reference to FIGS. 1 and 2. Features of the disclosure are described in the context of systems and timing diagrams as described with reference to FIGS. 3-7C. These and other features of the disclosure are further illustrated by and described with reference to an apparatus diagram and flowcharts that relate to memory operations across banks with multiple column access as described with reference to FIGS. 8-10.

Figure 1:
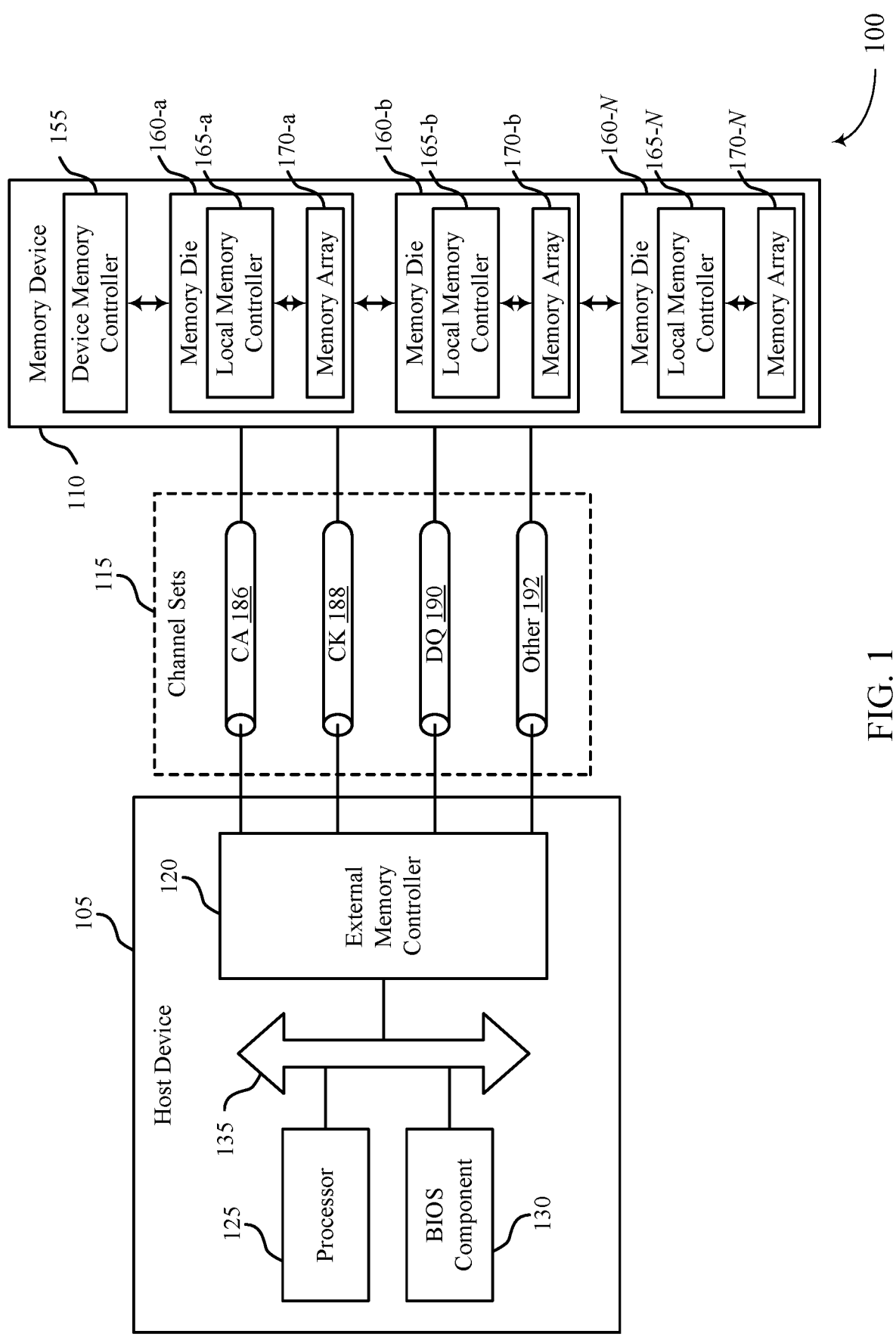
FIG. 1 illustrates an example of a system that supports memory operations across banks with multiple column access in accordance with examples as disclosed herein.

FIG. 1 illustrates an example of a system 100 that supports memory operations across banks with multiple column access in accordance with examples as disclosed herein. The system 100 may include a host device 105, a memory device 110, and a plurality of channel sets 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channel sets 115. The channel sets 115 may be operable to support communications between the external memory controller 120 and the memory device 110. Each channel set 115 may be an example of a transmission medium that carries information between the host device 105 and the memory device 110. Each channel set 115 may include one or more signal paths (e.g., a transmission medium, a conductor) between terminals associated with the components of the system 100. A signal path may be an example of a conductive path operable to carry a signal. For example, a channel set 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel set. One or more signal paths may be combined into a signal bus.

Channel sets 115 (and associated signal paths and terminals) may be dedicated to communicating one or more types of information. For example, the channel sets 115 may include one or more command and address (CA) channel sets 186, one or more clock signal (CK) channel sets 188, one or more data (DQ) channel sets 190 (e.g., a data bus), one or more other channel sets 192, or a combination thereof. In some examples, signaling may be communicated over the channel sets 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, clock signal channel sets 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channel sets 190 may be operable to communicate information (e.g., data, control information) between the host device 105 and the memory device 110. For example, the data channel sets 190 may communicate information (e.g., bi-directional) to be written to the memory device 110 or information read from the memory device 110.

The channel sets 115 may include any quantity of channels or signal paths (including a single channel or signal path). In some examples, a channel set 115 may include multiple individual signal paths (e.g., in a bus). For example, a channel set may be ×4 (e.g., including four signal paths), ×8 (e.g., including eight signal paths), ×16 (including sixteen signal paths), etc.

Figure 2:
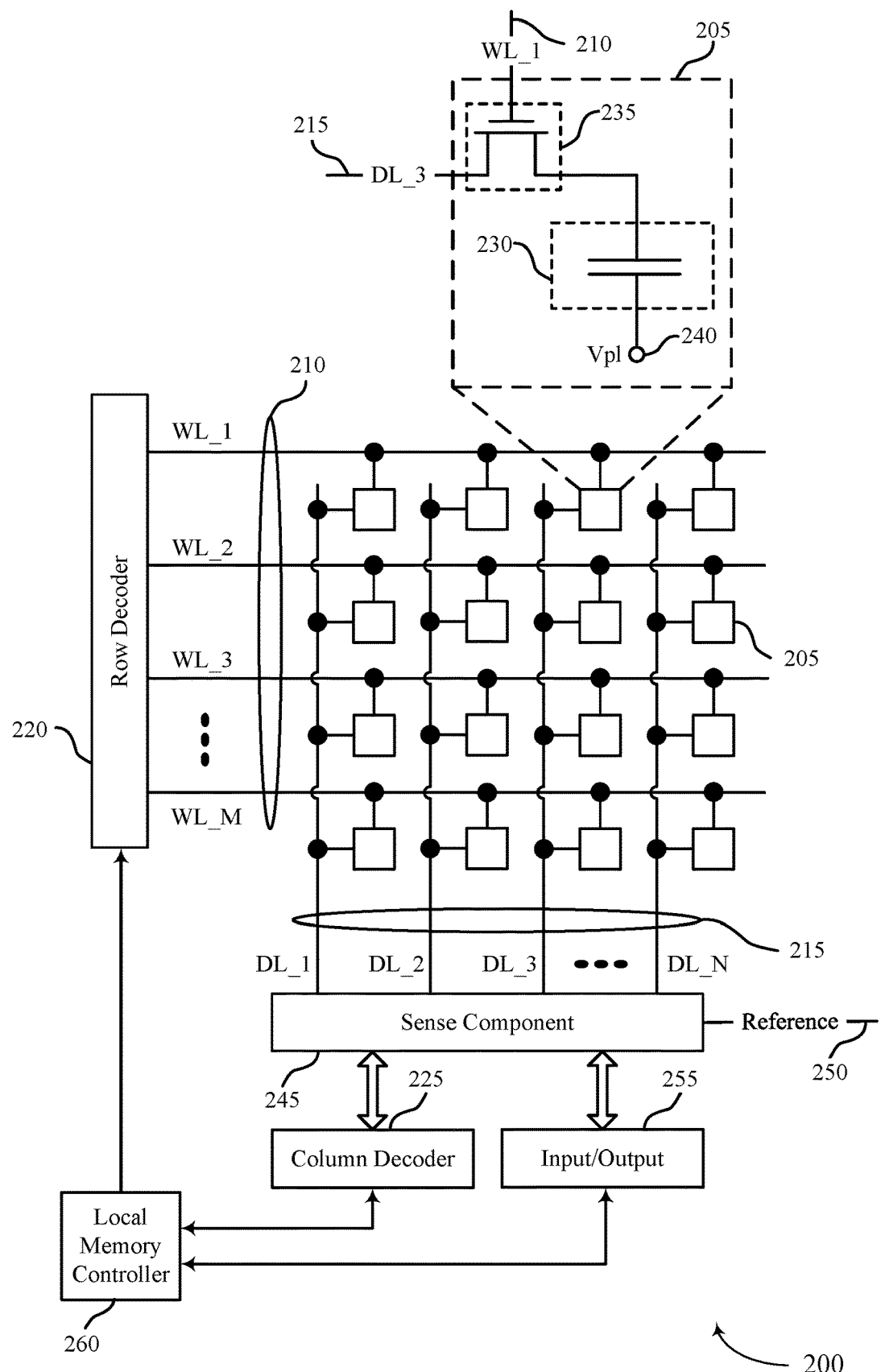
FIG. 2 illustrates an example of a memory die that supports memory operations across banks with multiple column access in accordance with examples as disclosed herein.

FIG. 2 illustrates an example of a memory die 200 that supports memory operations across banks with multiple column access in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Figure 3:
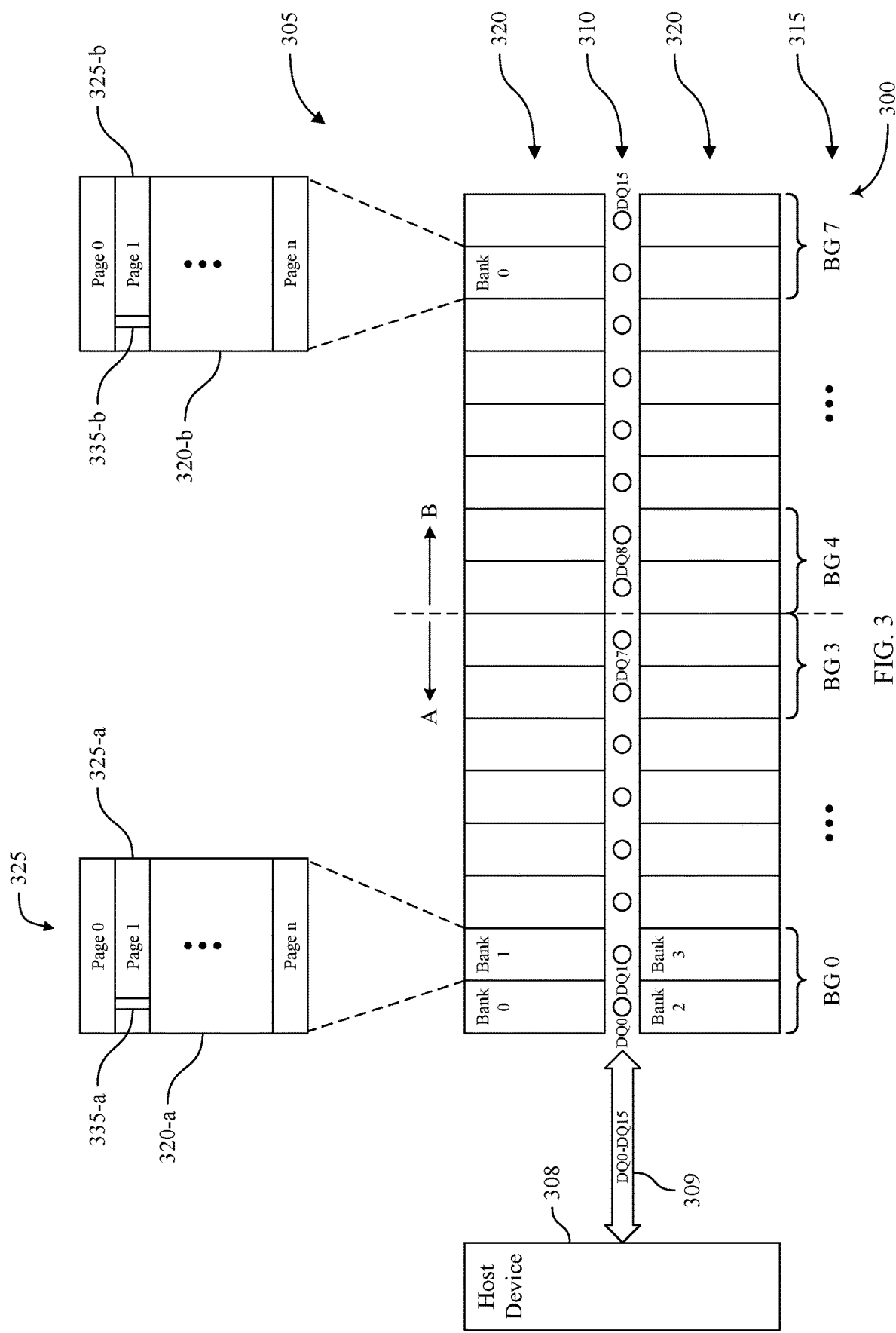
FIG. 3 illustrates an example of a system that supports memory operations across banks with multiple column access in accordance with examples as disclosed herein.

FIG. 3 illustrates an example of a system 300 that supports memory operations across banks with multiple column access in accordance with examples as disclosed herein. The system 300 may be an example of a system 100 as described with reference to FIG. 1 or aspects thereof.

The system 300 may include a memory device 305 configured to communicate data with a host device 308 over a data bus 309. The host device 308 and data bus 309 may be examples of a host device 105 and a channel set 190 as described with reference to FIG. 1 or aspects thereof.

The memory device 305 may include bank groups 315, each including a quantity of memory banks 320 for communicating with the host device via the data bus 309 using data channels 310, which may be divided into channel groups that may each include one or more subsets. A channel group that consists of a single subset may be referred to as a subset herein. The quantity of data channels may vary. For example, there may be four, eight, 16, 32, or other quantity of data channels divided into two, four, or more channel groups. In some examples, the memory device 305 may be operated according to different bus widths, depending on an application. The quantity of bank groups and memory banks may also vary. The depicted example includes sixteen data channels 310 (DQ0-DQ15) and eight bank groups 315 (BG0-BG7), with each bank group 315 including four memory banks 320. For example, BG0 may include bank 0, bank 1, bank 2, and bank 3. Other values are also possible.

Each memory bank 320 may include a plurality of pages 325 for storing data. Each page may include a certain quantity of memory cells (e.g., 1024) arranged as columns (e.g., 16 column planes×64 columns). In some examples, the columns and rows may correspond to word lines and digit lines, as discussed with respect to FIG. 2. When data associated with a memory location (e.g., addressed columns) associated with the page is accessed, a set of columns of the page may be accessed. This may activate the memory cells associated with the memory location. When a read or a write operation is performed, the set of columns associated with the memory location may be accessed and data associated with the memory cells may be communicated in bursts where the amount of data may be based on a burst length and the bus width. For example, if a burst length is sixteen, then the memory die may operate with a bus width of four having 64 bits of data per burst, a bus width of eight having 128 bits of data per burst, or a bus width of 16 having 256 bits of data per burst. A burst may include consecutive clock cycles (e.g., on both clock edges).

In some examples, the total quantity of bits over a burst may exceed the quantity of bits communicable in a single read or write operation (e.g., when the memory device is used in a larger bus mode). In those cases more than one memory access may be performed to communicate all of the data associated with the read or write operation to or from the page. A first set of columns associated with the page may be accessed during a first memory access and a second set of columns associated with the page may be accessed during the second memory access. The first and second memory accesses may be performed in series and may communicate data on the same channel group. For example, the first and second memory accesses may both communicate data on a channel group that includes a lower half of the data channels or an upper half of the data channels 310.

A command delay may occur between consecutive accesses to allow page operations (e.g., closing one access operation and opening the next access operation) to occur in-between. The command delay may have minimum timing requirements that must be satisfied between access commands. In some examples, the command delay may be different for accessing a different bank group (tCCD_S) or the same bank group (tCCD_L). In some examples, the command delay tCCD_L may be based on a certain amount of time (e.g., five ns, six ns, nine ns, ten ns, etc.). In some examples, the command delay tCCD_S may be based on a certain quantity of clock cycles and burst length and therefore may vary based on the clock rate. In some examples, for a burst length of 32 and a DDR, the tCCD_S may be equal to the time taken for sixteen clock cycles, as shown in Table 1:

TABLE 1

| Speed (MHz) | Clock Cycle Time (ns) | tCCD_S (ns) |
| --- | --- | --- |
| 3200 | 0.625 | 10.000 |
| 3600 | 0.556 | 8.896 |
| 4000 | 0.500 | 8.000 |
| 4400 | 0.455 | 7.280 |
| 4800 | 0.417 | 6.672 |
| 5200 | 0.385 | 6.160 |
| 5600 | 0.358 | 5.728 |
| 6000 | 0.334 | 5.344 |
| 6400 | 0.313 | 5.008 |
| 6800 | 0.295 | 4.720 |
| 7200 | 0.278 | 4.448 |
| 7600 | 0.264 | 4.224 |
| 8000 | 0.250 | 4.000 |
| 8400 | 0.239 | 3.824 |
| 8800 | 0.228 | 3.648 |
| 8800 | 0.228 | 3.648 |
| 9600 | 0.209 | 3.344 |
| 10400 | 0.193 | 3.088 |
| 11200 | 0.179 | 2.864 |
| 12000 | 0.167 | 2.672 |
| 12800 | 0.157 | 2.512 |
| 13600 | 0.148 | 2.368 |
| 14400 | 0.139 | 2.224 |
| 15200 | 0.132 | 2.112 |
| 16000 | 0.125 | 2.000 |
| 16800 | 0.120 | 1.920 |

The bank groups of the memory device may be separated into multiple portions (e.g., two portions: Portion A and Portion B), and each portion may communicate with the host device 308 on a different channel group (or subsets of the channel groups) of the data channels. Maintaining data from each portion on separate subsets of the bus may keep the internal routing of the data from traversing the length of the die, which may cause a substantial die increase and may create challenges in meeting timing parameters. Further, the data associated with both portions of bank groups may be accessible and may be communicated with the host device 308 at the same time. As a result, access commands that use the respective portions may be performed concurrently.

During use, an access command associated with a memory location located in one of the portions may be received (e.g., from host device 308) by the memory device 305. The access command may include an indication of a physical or logical memory location of the memory device to associate with the command for reading or writing data. For example, the memory device 305 may receive a read access command indicating a memory location from which to read data or a write command indicating a memory location where to store data included with the write access command. The memory location may be associated with a page 325 of a memory bank 320 of a bank group 315.

When the total quantity of bits over a burst exceeds the quantity of bits communicable in an access command (e.g., when the memory device is used in a larger bus mode), the following may occur upon receipt of an access command associated with a memory location (e.g., memory location 335-*a*). A first set of columns of the page (e.g., page 325-*a*) associated with the memory location may be accessed by the memory device 305 and a first set of data may be communicated between the page and the host device 308 via a first channel group of data channels 310 (e.g., data channels DQ0-DQ7) associated with the portion (e.g., portion A) of the memory device associated with the bank group (e.g., BG0) associated with the bank (e.g., bank 1) associated with the page.

After a certain amount of time has elapsed (e.g., tCCD_L), a second set of columns of the page (e.g., page 325-*a*) may be accessed by the memory device 305 and a second set of data may be communicated between the page and the host device 308 via the same channel group of data channels 310 used for the first set of data. To access the second set of columns, an internal command may be generated by the memory device 305, as discussed herein. In some examples, the internal command may be generated before the first set of data is communicated.

In some examples, a second access command may also be received (e.g., from host device 308) by the memory device 305 after or concurrent with the first access command. The second access command may be a same type of access command (e.g., a read or a write access command) as the first access command and may be associated with a second memory location located in a bank group in a different portion of the memory device than the first memory location so that data associated with the second access command may be communicated on different data channels than the first access command. In some examples, because the access command uses a separate portion of the memory device, it may be performed concurrently with the first access command.

Upon receipt of the second access command, a third set of columns of the second page (e.g., page 325-*b*) associated with the second memory location (e.g., 335-*b*) may be accessed by the memory device 305 and a third set of data may be communicated between the second page and the host device 308 via a second channel group of data channels 310 (e.g., data channels DQ8-DQ15) associated with the second portion (e.g., Portion B) of the memory device associated with the bank group (e.g., BG7) associated with the bank (e.g., bank 0) associated with the second page. Because the first and second access commands use different channel groups of the data channels 310, the access commands may be processed at the same time and the data sets may be communicated concurrently on the different channel group of data channels.

Figure 4:
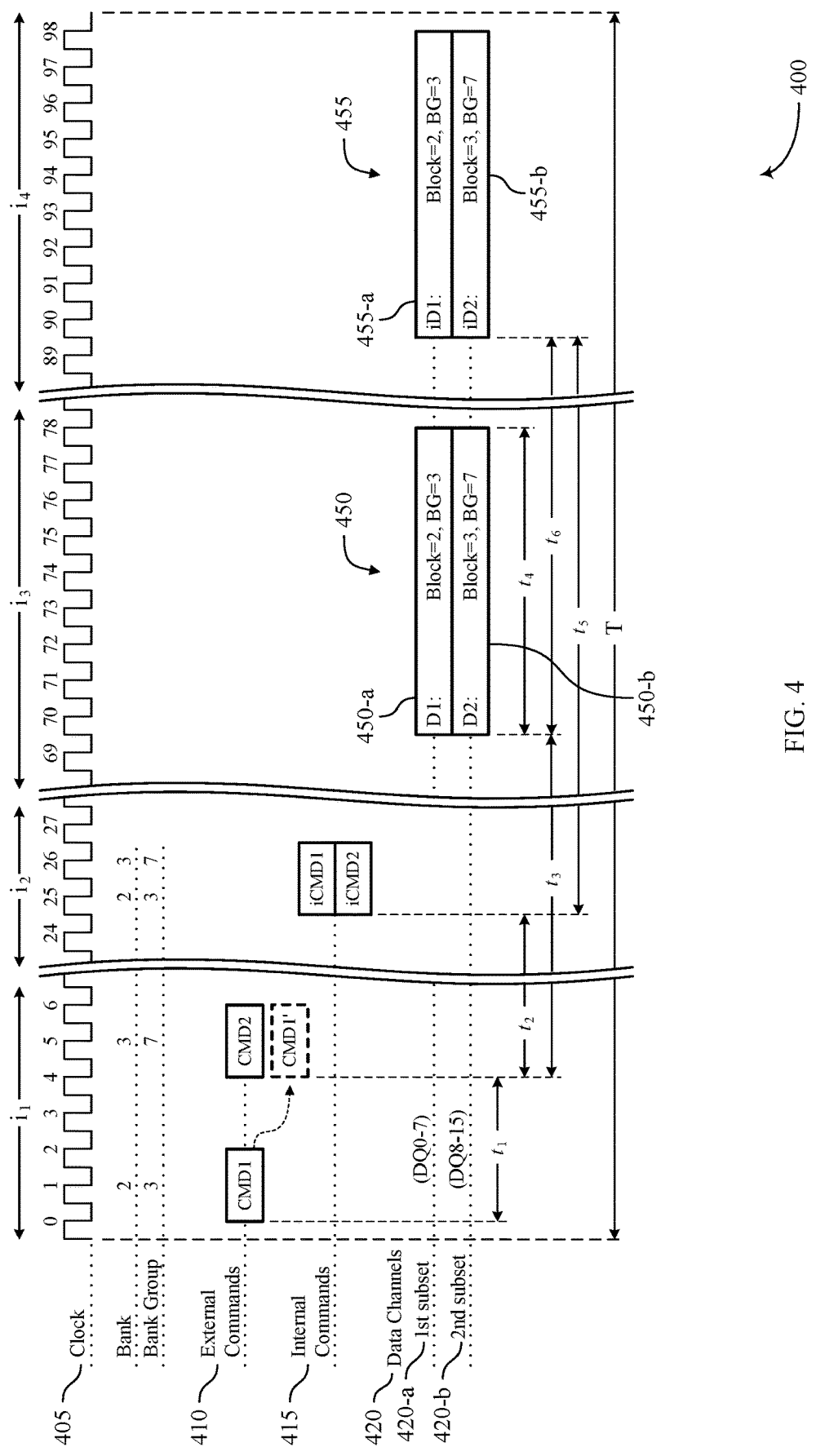
FIG. 4 illustrates an example timing diagram that supports memory operations across banks with multiple column access in accordance with examples as disclosed herein.

FIG. 4 depicts an example timing diagram 400 that supports memory operations across banks with multiple column access in accordance with examples as disclosed herein. The timing diagram 400 may illustrate the timing and relative length of signals transmitted during a time interval T between a host device and a memory device, such as the host device 308 and the memory device 305 described with reference to FIG. 3. Thus, timing diagram 400 may illustrate the operation of one or more components described above with reference to FIGS. 1, 2, and 3. The timing diagram 400 may illustrate an example of commands and data sets sent over one or more channel sets, such as a command channel set and a data channel set, between the host device and the memory device, as well as commands generated and used internally by the memory device.

More specifically, the timing diagram 400 may illustrate an example of first and second access commands CMD1 and CMD2, such as read commands, that are received from a host device and that include multiple column accesses for each access command. In response to the first access command CMD1, which may be associated with a first page, a first internal access command iCMD1 may be generated, which may result in first and second sets of data D1 and iD1 being communicated between the memory device and the host device on a first subset 420-a of a first channel group of data channels. Similarly, in response to the second access command CMD2, which may be associated with a second page, a second internal access command iCMD2 may be generated, which may result in third and fourth sets of data D2 and iD2 being communicated between the memory device and the host device on a second subset 420-b of a second channel group of data channels.

Timing diagram 400 may include a clock signal 405 configured to control signal timing and other aspects of the timing diagram 400. With respect to the clock signal, timing diagram 400 illustrates example timing associated with external commands 410 received from the host device, internal commands 415 generated internally by the memory device, and data communicated on data channels 420 associated with the external and internal commands. Signaling may be communicated using SDR or DDR signaling. Other options may also be available.

The data channels 420 may be divided into a first subset 420-a and a second subset 420-b. In some examples, the second subset 420-b may be mutually exclusive of the first subset 420-a such that a data channel may be in the first or second subset but not in both. In some examples, the first and second subsets 420-a and 420-b of the data channels may respectively correspond to a lower half and an upper half of the data channels, or vice versa. In some examples, there may be sixteen data channels (e.g., DQ0-DQ15), with eight of the sixteen (e.g., DQ0-DQ7) in the first subset and the other eight of the sixteen (e.g., DQ8-DQ15) in the second subset. Timing diagram 400 also displays example bank and bank group values that may be associated with respective external and internal commands.

During a first interval $i_1$, external commands 410 may be received by the memory device. An external command may be a memory access command received by the memory device from an external source, such as a host device. In the depicted example, two external commands 410 are illustrated: a first access command CMD1 associated with a first page, and a second access command CMD2 associated with a second page and received after an amount of time $t_1$ has elapsed following the first access command CMD1.

The external commands 410 may be read access commands or write access commands that cause data to be communicated between the external source, such as the host device, and the memory device. The external commands 410 may be a same type of command (e.g., may both be read access commands or may both be write access commands). In some examples, each external command 410 may be processed by the memory device as soon as it is received.

In some examples, the first and second external commands 410 may be grouped based on the timing of the commands (e.g., the commands being within a certain amount of time of each other). In some examples, processing of the first access command CMD1 may be delayed until the second access command CMD2 is received e.g., to align the processing of the external commands. For example, as depicted by the dashed box in FIG. 4, CMD1 may be delayed (to CMD1') so that the processing of CMD1 may be aligned with the processing of CMD2. The aligning of the external commands 410 may result in the communication of the data sets 450 associated with the aligned commands to be aligned with each other, as discussed herein. In some examples, if the second command CMD2 is not received within a certain amount of time after the first command CMD1, processing of the first command may proceed (e.g., without further delay).

Each external command 410 may include an indication of a memory location of the memory device to associate with the command for reading or writing data. The indicated memory location may be within a respective page of a respective bank of a respective bank group, as discussed with respect to FIG. 3. The memory locations associated with the external commands 410 may be positioned in different portions of the memory (e.g., Portions A and B of FIG. 3) so as to use different subsets of the data channels. For example, as illustrated in timing diagram 400, the first access command CMD1 may be associated with bank 2 of bank group 3—which is within Portion A of FIG. 3—and the second access command CMD2 may be associated with bank 3 of bank group 7—which is within Portion B of FIG. 3. Because the memory locations are in different portions, the timing $t_1$ between the two commands may be short, even zero. In some examples, $t_1$ may be equal to tCCD_S/2.

During a second interval $i_2$, internal commands 415 may be internally generated by the memory device to access the second portion of data associated with the external commands 410. An internal command 415 may be a memory access command generated by the memory device. Each internal command 415 may be associated with a respective external command 410 and may be the same type of command (e.g., read or write command) as the external commands 410. For example, in the depicted example, two internal commands 415 are illustrated: a first internal access command iCMD1 associated with the first access command CMD1, and a second internal access command iCMD2 associated with the second access command CMD2.

Each internal command 415 may include an indication of a memory location of the memory device to associate with the second portion of data. The indicated memory location may be in the same page as the memory location associated with the associated external command 410. As such, the memory location may be in the same bank and bank group as the memory location associated with the associated external command 410. For example, as shown in the depicted example, the first internal access command iCMD1 may be associated with a same first page of the same bank (e.g., bank 2) and bank group (e.g., bank group 3) as the first access command CMD1 and the second internal access command iCMD2 may be associated with a same second page of the same bank (e.g., bank 3) and bank group (e.g., bank group 7) as the second access command CMD2. When CMD1 and iCMD1 are processed, first and second sets of columns of the first page may be respectively accessed by the memory device and when CMD2 and iCMD2 are processed, third and fourth sets of columns of the second page may be respectively accessed by the memory device.

The internal commands 415 may be generated after an amount of time $t_2$ has elapsed following the receipt or initiation of processing of the first or second access command CMD1 or CMD2. For example, $t_2$ may be the command delay associated with CMD1 or CMD2. Because the internal commands 415 may be accessing the same bank groups as the associated external commands 410, $t_2$ may be equal to tCCD_L. In some examples, $t_2$ may be 5 ns.

In some examples, the internal commands 415 may be generated concurrently with each other. This may align the processing of the internal commands, which may result in the communication of the data sets 450 associated with the aligned commands to be aligned with each other, as discussed herein. In the depicted example, the first internal command iCMD1 is generated concurrently with the second internal command iCMD2.

During a third interval $i_3$, data associated with the external commands 410 may be communicated between the external device (e.g., the host device) and the memory device. The data may be communicated as sets of data 450, which may also be referred to herein as data sets 450. Each data set 450 may correspond to a respective external command 410. For example, data sets D1 and D2 may be associated with access commands CMD1 and CMD2, respectively. The sets of data 450 may be communicated on different subsets of the data channels, based on the bank group associated with the set of data, as discussed with respect to FIG. 3. For example, for a set of data associated with bank groups 0-3 of FIG. 3—which are within Portion A of FIG. 3—the set of data may be communicated via a first subset 420-$a$ of the data channels (e.g., DQ0-7). Similarly, for a set of data associated with bank groups 4-7 of FIG. 3—which are within Portion B of FIG. 3—the set of data may be communicated via a second subset 420-$b$ of the data channels (e.g., DQ8-15). In the depicted example, data sets D1 and D2 may be respectively communicated via the first and second subsets 420 and 420-$b$ of the data channels.

For read access commands, the data sets D1 and D2 associated with the first and second access commands CMD1 and CMD2 may be obtained from the memory device and put on the different subsets of the data channels for transmitting to the host device. For write commands, the data sets D1 and D2 associated with the first and second access commands CMD1 and CMD2 may be received from the host device over the different subsets of the data channels to be stored in the memory device.

The data sets 450 may be communicated based on an amount of time $t_3$ for processing the external commands 410. Data sets 450 associated with different external commands 410 may be communicated concurrently on the respective subsets of data channels. In examples where the processing of the external commands CMD1 and CMD2 are aligned, the associated data sets D1 and D2 may also be aligned. For example, in the depicted example, data sets D1 and D2 associated with CMD1 and CMD2 are concurrently communicated via DQ0-7 and DQ8-15, respectively. The length of each data set 450 may be $t_4$, which may be based on the amount of data communicated in the data set, or the burst length. In some examples, the burst length may be equal to eight clock cycles, sixteen clock cycles, 32 clock cycles, etc.

During a fourth interval $i_4$, data associated with the internal access commands 415 may be communicated between the external device (e.g., the host device) and the memory device. The data may be communicated as sets of data 455, which may be similar to sets of data 450. The sets of data 455 may also be referred to herein as data sets 455. Each data set 455 may correspond to a respective internal access command 415. For example, data sets iD1 and iD2 may be associated with internal access commands iCMD1 and iCMD2, respectively. Similar to data sets 450, the sets of data 455 may be communicated on different subsets of the data channels, based on the bank group associated with the set of data. In the depicted example, data sets iD1 and s iD2 may be respectively communicated via the first and second subsets 420 and 420-$b$ of the data channels.

As discussed herein, each internal command 415 may be associated with the same page as an associated external command 410. As such, the data sets 455 associated with each internal command 415 may be communicated on the same subset of the data channels as the associated data set 450. For example, in the depicted example, the data sets iD1 and iD2 may be communicated via the same subsets as D1 and D2, respectively (e.g., first and second subsets 420 and 420-$b$, respectively).

The data sets 455 may be communicated based on an amount of time is for processing the internal commands 415. As with the data sets 450, the data sets 455 associated with different internal commands 415 may be communicated concurrently on the respective subsets of data channels. In examples where the internal commands iCMD1 and iCMD2 are aligned, the associated data sets iD1 and iD2 may also be aligned. The data sets 455 may be communicated after an amount of time $t_6$ has elapsed following the first data sets 455. In some examples, the amount of time for processing the internal access commands may equal the amount of time for processing the external commands. In those examples, $t_5$ may be equal to $t_3$, and $t_6$ may be equal to $t_2$. In some examples, the data sets 455 may each include the same amount of data as the data sets 450 (e.g., have the same burst length). In those examples, the time to communicate each data set 455 may also be equal to $t_4$. In the depicted example, the second data sets iD1 and iD2 associated with iCMD1 and iCMD2 are concurrently communicated via DQ0-7 and DQ8-15, respectively.

In some examples, the respective data sets 450 and 455 associated with each external command may represent different halves of a data word. For example, a data set 450 may represent a lower half (e.g., D0-D7) of a data word (D0-D15) and a corresponding data set 455 may represent an upper half (e.g., D8-D15) of the data word. In those cases, instead of concurrently communicating the lower and upper halves of the words on separate subsets of the data channels (e.g., lower half D0-D7 on first subset DQ0-DQ7 and upper half D8-D15 on second subset DQ8-DQ15), as in other devices, both the lower and upper halves of the word may be communicated on the same subset of data channels (e.g., lower bytes D0-D7 and upper bytes D8-D15 on first subset DQ0-DQ7 or lower bytes D0-D7 and upper bytes D8-D15 on second subset DQ8-DQ15). Communicating the first and second sets of data 450 and 455 on the same subset of data channels may allow all of the bank groups to be addressable.

The discussion above has been focused on receiving two external commands 410 during interval $i_1$. However, more or less external commands 410 may be received during interval $i_1$. In some examples, a single external command 410 may be received by the memory device during the first interval $i_1$. In those cases, the second access command CMD2 may not be received and the associated second internal command iCMD2 may be omitted so that a single internal command iCMD1 may be generated during interval $i_2$. In $i_3$, the first data set D2 corresponding to the second access command CMD2 may be omitted and in $i_4$, the second data set iD2 corresponding to the second internal command iCMD may be omitted. In other words, the first access command CMD1 may be received during interval $i_1$, the associated internal command iCMD1 may be generated during interval $i_2$, and first and second data sets D1 and iD1 may be communicated on the same subset of the data channels during intervals $i_3$ and $i_4$, respectively.

In other examples, four, eight, twelve, sixteen or other quantity of external commands may be received in interval $i_1$. For each of these external commands, respective internal commands may be generated and respective first and second sets of data may be accessed and communicated via respective subsets of the data channels. FIGS. 5, 6, and 7 depict such examples. In some examples, the internal commands may be generated subsequent to the receipt of all of the external commands, the respective first sets of data may be communicated subsequent to the generation of all of the internal commands, and the respective second sets of data may be communicated subsequent to the communication of all of the first sets of data.

FIGS. 5A and 5B depict another example of a timing diagram 500 that supports memory operations across banks with multiple column access in accordance with examples as disclosed herein. Timing diagram 500 is similar to timing diagram 400 except that it involves four external commands 510 instead of two.

Turning to FIG. 5A, during the first interval $i_1$, four access commands 510 may be received by the memory device, as depicted by CMD1, CMD2, CMD3, and CMD4. Each access command 510 may be associated with a respective bank and may be the same type of access command (e.g., a read or write access command). In some examples, each access command 510 may be associated with a different bank group, as depicted in timing diagram 500. An amount of time $t_7$ may occur between access commands 510 that use the same subset 520. In some examples, the $t_7$ may be equal to tCCD_S, the delay time for accesses of different bank groups.

During the second interval $i_2$, four internal commands 515 respectively associated with the four access commands may be internally generated by the memory device, as depicted by iCMD1, iCMD2, iCMD3, and iCMD4. Each internal command 515 may indicate a same page for communicating data as the associated access command 510. Processing of the access commands 510 and internal access commands 515 may access respective first and second sets of data of the respective banks associated with the access command 510. In some examples, the four access commands 510 may all be received before the four internal commands are generated.

Turning to FIG. 5B, during the third and fourth intervals $i_3$, and $i_4$, the respective first and second data sets 550 and 555 of the respective banks associated with the access commands 510 may be communicated between the external device (e.g., the host device) and the memory device via respective channel groups (or subsets) 520-a and 520-b of the data channels. Timing diagram 500 depicts first data sets D1, D2, D3, and D4 and second data sets iD1, iD2, iD3, and iD4 respectively associated with access commands CMD1, CMD2, CMD3, and CMD3. Using the two subsets, each first or second data set 550, 555 may at least partially overlap another first or second data set. In some examples, each data set may be communicated concurrently with another data set. For example, first access command D1 may overlap first access command D2.

Each subset 520-a, 520-b may communicate a single data set at a time, so while the subsets may concurrently communicate data with respect to each other, some of the first data sets 550 (e.g., data sets D3 and D4) may be communicated after other first data sets 550 (e.g., data sets D1 and D2) have been communicated. Similarly, some of the corresponding second data sets 555 may be communicated after other corresponding second data sets 550 have been communicated. To accommodate this, the access commands 510 and corresponding internal access commands 515 may be timed accordingly. In some examples, the first data sets 550 may be interleaved on the data channels. For example, first data sets D3 and D4 may be communicated subsequent to first data sets D1 and D2. The second data sets 555 may be interleaved on the data channels in a similar manner.

In some examples, the access commands 510 and 515 may be timed so that adjacent data sets may be communicated with little or no time gap between them. In some examples, data sets communicated on a same subset of data channels may abut each other. For example, data sets D1 and D3, or iD1 and iD3 may abut each other on the first subset 520-a. In some examples, respective first or second sets of data associated with different banks may be communicated concurrently on different subsets of the data channels. For example, data set D1 may be communicated concurrently with data set D2 and data set iD1 may be communicated concurrently with data set iD2.

Figure 6A:
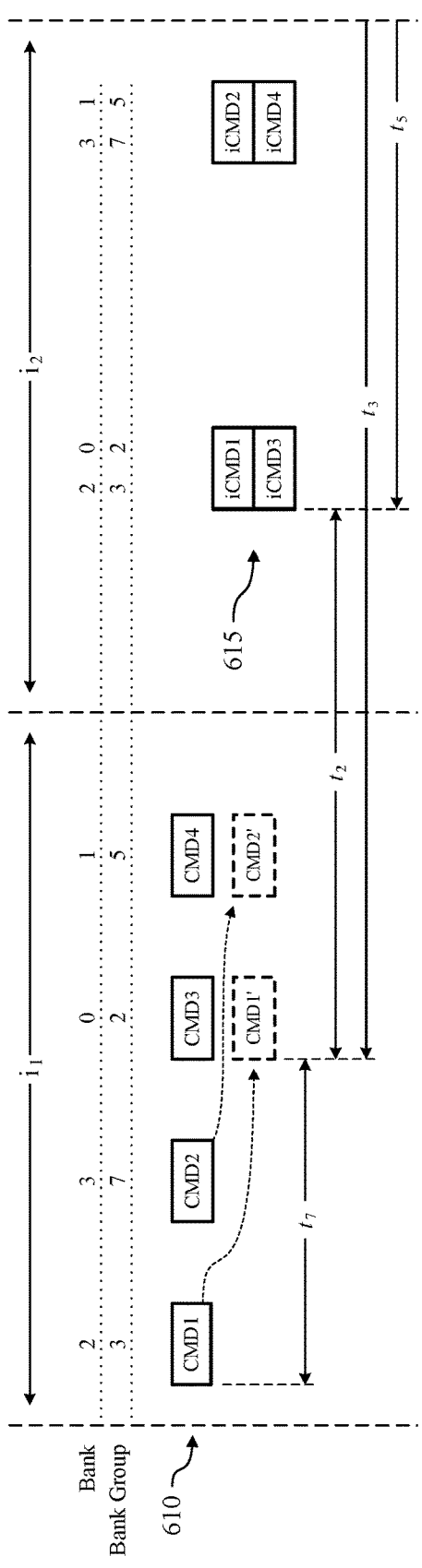
FIG. 6A-6B illustrate another example timing diagram that supports memory operations across banks with multiple column access in accordance with examples as disclosed herein.
Figure 6B:
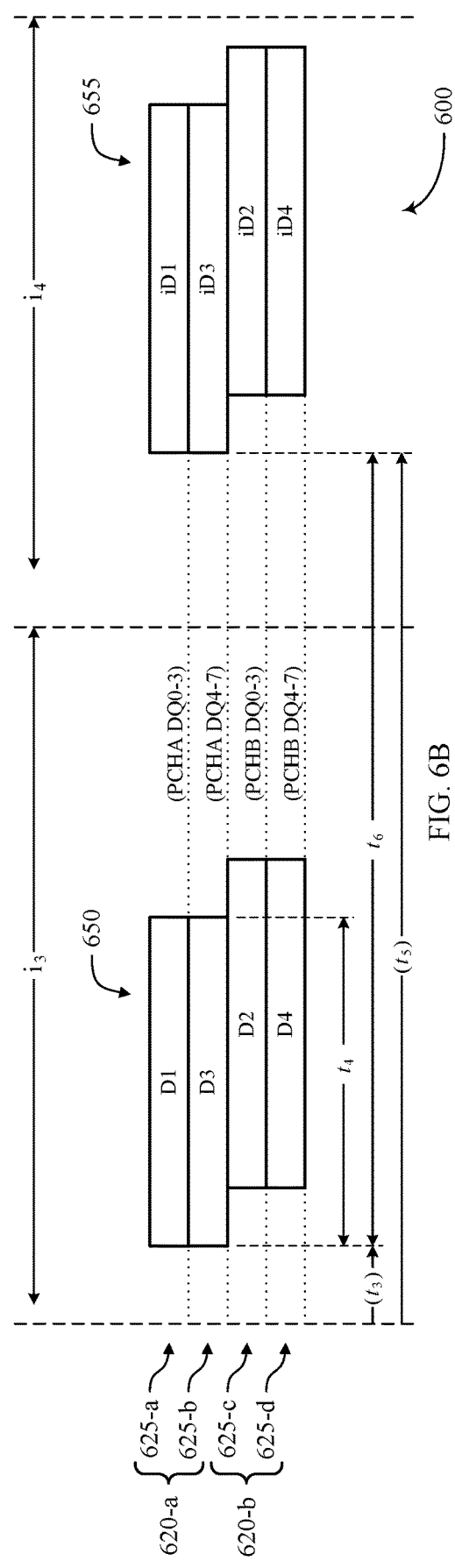

FIGS. 6A and 6B depict another example of a timing diagram 600 that supports memory operations across banks with multiple column access in accordance with examples as disclosed herein. Timing diagram 600 is similar to timing diagram 500 except that the data channels are divided into four subsets instead of two. In some examples, the data channels are divided into two separate channel groups 620 (620-a, 620-b), and first and second portions of each channel group may be considered subsets 625 (625-a, 625-b, 625-c, 625-d). In some examples, the data channels of each subset 625 may be exclusive of the data channels of the other subsets (e.g., the data channels of different subsets 625 may not overlap). Additionally or alternatively, the data channels of the first channel group 620-a may not overlap with the data channels of the second channel group 620-b. The subsets 625 may each have a lesser quantity of data channels than the subsets 420 and 520 discussed with respect to FIGS. 4 and 5B. For example, each subset 625 may include four data channels instead of eight. The additional subsets may allow additional data sets to be communicated at a time, although it may take longer to complete the communication because of the lesser quantity of data channels per subset.

Turning to FIG. 6A, during the first and second intervals $i_1$ and $i_2$, four access commands 610 (e.g., CMD1, CMD2, CMD3, and CMD4) may be received by the memory device and four associated internal commands 615 (e.g., iCMD1, iCMD2, iCMD3, and iCMD4) may be internally generated by the memory device, similar to that shown in timing diagram 500.

Turning to FIG. 6B, as in timing diagram 500, during the third and fourth intervals $i_3$ and $i_4$, the respective first and second data sets 650 and 655 of the respective banks associated with the access commands 610 may be communicated between the external device (e.g., the host device) and the memory device. However, instead of using just two subsets of data channels, the data sets may be communicated using four subsets (e.g., subsets 625-a, 625-b, 625-c, and 625-c) of data channels, two each for respective first and second channel groups 620-a and 620-b. Because four subsets of data channels may be used, the first and second data sets 650 and 655 may be communicated four at a time (e.g., up to four data sets may at least partially overlap). In some examples, each first data set 650 or each second data set 655 may overlap each other on separate subsets 625 of the data channels so that no first or second data set may wait for another first or second data set to complete before being communicated. For example, in timing diagram 600, first data sets D1, D3, D2, and D4 may at least partially overlap each other on subsets 625-a, 625-b, 625-c, and 625-d, respectively.

In some examples, two or more first data sets 650 may be communicated concurrently on a separate subset 625 of the data channels. For example, in timing diagram 600, first data sets D1 and D3 may be communicated concurrently on subsets 625-a and 625-b of first channel group 620-a, and first data sets D2 and D4 may be communicated concurrently on subsets 625-c and 625-d of second channel group 620-b. The corresponding second data sets 655 may likewise be communicated concurrently. In some examples, the cycle of communicating one or more data sets may occur subsequent to the cycle of communicating the other data sets. While data sets communicated by a channel group 620 may occur concurrently, in some cases data sets transmitted via different channel groups 620 may not fully overlap in time (e.g., due to the offset in command timing). That is, one or more of the concurrently sent data sets may be offset from the other data sets. For example, first data sets D2 and D4 may be offset from first data sets D1 and D3 and corresponding second data sets iD2 and iD4 may be offset from second data sets iD1 and iD3. In some examples, the communication of each first or second data set 650 may take longer to complete than when using fewer subsets of data channels because there may be fewer data channels per subset 625. To accommodate this, the access commands 610 and corresponding internal access commands 615 may be timed accordingly.

FIGS. 7A-7C depict another example of a timing diagram 700 that supports memory operations across banks with multiple column access in accordance with examples as disclosed herein. Timing diagram 700 is similar to timing diagram 600 except that it involves twelve access commands instead of four.

As shown in FIGS. 7A and 7B, during the first and second intervals $i_1$ and $i_2$, twelve access commands 710 (e.g., CMD1-CMD12) may be received by the memory device and twelve associated internal commands 715 (e.g., iCMD1-iCMD12) may be internally generated by the memory device.

In some examples, processing of one or more of the external commands 710 may be delayed, e.g., to align the processing of two or more external commands 710. This may result in the data sets 750 associated with the aligned commands to also be aligned. For example, as shown by the dashed boxes in FIG. 7A, CMD1 may be delayed so that the processing of CMD1 may be respectively aligned with the processing of CMD3, which may result in data sets D1 and D3, which are associated with CMD1 and CMD3, to be aligned with each other. Similarly, CMD2, CMD5, CMD6, CMD9, and CMD10 may be delayed so that the processing of those commands may be respectively aligned with the processing of CMD4, CMD7, CMD8, CMD11, and CMD12, which may result in data sets D2, D5, D6, D9, and D10 being respectively aligned with data sets D4, D7, D8, D11, and D12.

In $i_2$, internal commands associated with the access commands may be internally generated. For example, in the depicted example, twelve internal commands iCMD1-iCMD12 are internally generated in $i_2$, respectively associated with the twelve access commands CMD1-CMD12. TIMING. Similar to timing diagrams 400, 500, and 600, data sets corresponding to the multiple access commands and the internal commands may be respectively communicated on the data channels in $i_3$ and $i_4$. Similar to the data sets discussed with respect to timing diagrams 400, 500, and 600, the data set associated with each internal command may be communicated on the same portion of the data channel as was used for the data set associated with the respective access command associated with the internal command.

Turning to FIG. 7C, during the third and fourth intervals $i_3$ and $i_4$, the respective first and second data sets 750 and 755 associated with the external commands 710 may be communicated between the external device (e.g., the host device) and the memory device via the subsets of the data channels. For example, in timing diagram 700, first data sets D1-D12 respectively associated with access commands CMD1-CMD12 may be communicated on subsets 720-a, 720-b, 720-c, and 720-d. In some examples, the first data sets 750 may be interleaved on the data channels. For example, data sets D9-D12 may be communicated subsequent to data sets D5-D8, which may be communicated subsequent to data sets D1-D4. The second data sets 555, may be interleaved on the data channels in a similar manner.

In some examples, the access commands 710 may be timed so that for each subset 720, adjacent first data sets 750 may be communicated with little or no time gap between them. Similarly, for each subset 720 the internal access commands 715 may be timed so that adjacent second data sets 755 may be communicated with little or no time gap between them.

In some examples, the internal access commands 715 may be timed with respect to the access commands 710 such that little or no time gap may occur between communication of the first data sets and communication of the second data sets. For example, for the subsets 720-a, 720-b, 720-c, and 720-d, second data sets iD1, iD3, iD2, and iD4 may be timed to respectively abut first data sets D9, D11, D10, and D12. This may allow the data channels associated with the subsets to be in (or mostly in) continuous use. This may result in an efficient use of the data channels.

In some examples, the time period $t_6$ between communicating the respective first sets of data and the respective second sets of data associated with each respective access command 710 may be based on a parameter received by the memory device (e.g. from a host device). The parameter may be communicated to the memory device at any time. In some examples, the parameter may be based on a second parameter associated with the time period $t_7$ between accesses to different bank groups of the memory device. In some examples, the parameter may be an integer multiple of the second parameter. In some examples, the integer multiple may be determined as a ceiling of a third parameter associated with the time duration $t_9$ between accesses to a same bank group divided by the second parameter. In some examples, the access commands 710 may be write commands and the third parameter may be associated with the time duration between write accesses to a same bank group.

Figure 8:
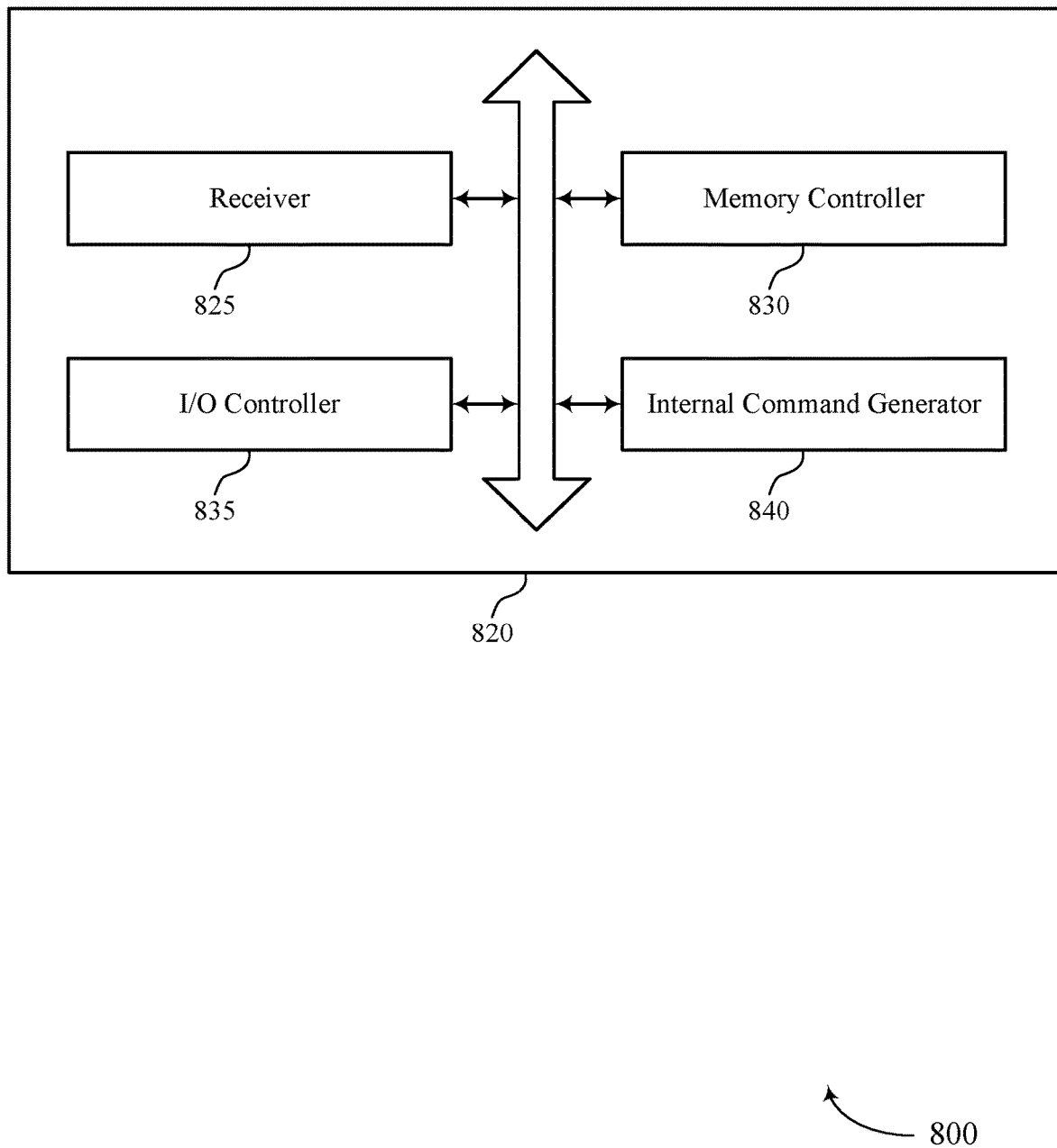
FIG. 8 shows a block diagram of a memory device that supports memory operations across banks with multiple column access in accordance with examples as disclosed herein.

FIG. 8 shows a block diagram 800 of a memory device 820 that supports memory operations across banks with multiple column access in accordance with examples as disclosed herein. The memory device 820 may be an example of aspects of a memory device as described with reference to FIGS. 1 through 3. The memory device 820, or various components thereof, may be an example of means for performing various aspects of memory operations across banks with multiple column access as described herein. For example, the memory device 820 may include a receiver 825, a memory controller 830, an I/O controller 835, an internal command generator 840, or any combination thereof. Each of these components may communicate, directly or indirectly, with one another (e.g., via one or more buses).

The receiver 825 may be configured as or otherwise support a means for receiving, at a memory device, a first access command associated with a first bank of a plurality of banks of the memory device, the memory device including a plurality of data channels. The memory controller 830 may be configured as or otherwise support a means for accessing a first set of columns of a first page of the first bank based at least in part on receiving the first access command. The I/O controller 835 may be configured as or otherwise support a means for communicating, by the memory device, a first set of data associated with the first set of columns of the first page of the first bank via a first subset of the plurality of data channels based at least in part on receiving the first access command. In some examples, the memory controller 830 may be configured as or otherwise support a means for accessing, subsequent to accessing the first set of columns of the first page of the first bank, a second set of columns of the first page of the first bank based at least in part on receiving the first access command. In some examples, the I/O controller 835 may be configured as or otherwise support a means for communicating, by the memory device, a second set of data associated with the second set of columns of the first page of the first bank via the first subset of the plurality of data channels based at least in part on receiving the first access command and subsequent to communicating the first set of data.

In some examples, the memory device may include a plurality of bank groups, each bank group including a plurality of banks. In some examples, a first bank group of the plurality of bank groups may include the first bank.

In some examples, the first subset of the plurality of data channels may include a lower half of the plurality of data channels or an upper half of the plurality of data channels. In some examples, the plurality of data channels may include sixteen data channels and the first subset may include eight of the sixteen data channels.

In some examples, to support accessing the second set of columns of the first page of the first bank, the internal command generator 840 may be configured as or otherwise support a means for generating an internal access command associated with the second set of columns of the first page of the first bank.

In some examples, the first access command may be a read access command or a write access command.

In some examples, the receiver 825 may be configured as or otherwise support a means for receiving, at the memory device, a second access command associated with a second bank of the plurality of banks, the second access command received subsequent to receiving the first access command and prior to communicating the first set of data. In some examples, the memory controller 830 may be configured as or otherwise support a means for accessing a third set of columns of a second page of the second bank based at least in part on receiving the second access command. In some examples, the I/O controller 835 may be configured as or otherwise support a means for communicating, by the memory device, a third set of data associated with the third set of columns of the second page of the second bank via a second subset of the plurality of data channels based at least in part on receiving the second access command, where communicating the third set of data is concurrent with communicating the first set of data. In some examples, the memory controller 830 may be configured as or otherwise support a means for accessing, subsequent to accessing the third set of columns of the second page of the second bank, a fourth set of columns of the second page of the second bank based at least in part on receiving the second access command. In some examples, the I/O controller 835 may be configured as or otherwise support a means for communicating, by the memory device, a fourth set of data associated with the fourth page of the second bank via the second subset of the plurality of data channels based at least in part on receiving the second access command, where communicating the fourth set of data at least partially overlaps with communicating the second set of data.

In some examples, the first bank may be within a first bank group of a first plurality of bank groups and the second bank may be within a second bank group of a second plurality of bank groups. In some examples, bank groups of the first plurality of bank groups may be mutually exclusive of bank groups of the second plurality of bank groups.

In some examples, the second subset of the plurality of data channels may be mutually exclusive of the first subset of the plurality of data channels. In some examples, the first subset of the plurality of data channels may include a lower half of the plurality of data channels or an upper half of the plurality of data channels and the second subset may include the other of the lower half of the plurality of data channels or the upper half of the plurality of data channels.

In some examples, the internal command generator 840 may be configured as or otherwise support a means for accessing the second set of columns of the first page of the first bank, where accessing the second set of columns of the first page of the first bank may include generating a first internal access command associated with the second set of columns of the first page of the first bank. In some examples, the internal command generator 840 may be configured as or otherwise support a means for accessing the fourth set of columns of the second page of the second bank where accessing the fourth set of columns of the second page of the second bank may include generating a second internal access command associated with the fourth set of columns of the second page of the second bank.

In some examples, generating the first internal access command may be performed concurrent with generating the second internal access command.

In some examples, the receiver 825 may be configured as or otherwise support a means for receiving, at a memory device, a plurality of access commands associated with respective banks of a plurality of banks of the memory device, the memory device including a plurality of data channels. In some examples, the memory controller 830 may be configured as or otherwise support a means for accessing respective first sets of data of the respective banks based at least in part on respective access commands of the plurality of access commands. In some examples, the I/O controller 835 may be configured as or otherwise support a means for communicating, by the memory device, the respective first sets of data of the respective banks via respective subsets of the plurality of data channels based at least in part on the respective access commands. In some examples, the memory controller 830 may be configured as or otherwise support a means for accessing respective second sets of data of the respective banks based at least in part on the respective access commands. In some examples, the I/O controller 835 may be configured as or otherwise support a means for communicating, by the memory device, the respective second sets of data of the respective banks via the respective subsets of the plurality of data channels based at least in part on the respective access commands, where a time period between communicating the respective first sets of data and the respective second sets of data associated with each of the respective access commands is based at least in part on a parameter received by the memory device.

In some examples, the parameter may be based at least in part on a second parameter associated with a time period between accesses to different bank groups of a plurality of bank groups of the memory device. In some examples, the parameter may be an integer multiple of the second parameter. In some examples, the integer multiple may be determined as a ceiling of a third parameter associated with a time duration between accesses to a same bank group of the plurality of bank groups divided by the second parameter.

In some examples, the plurality of access commands may include write commands and the third parameter may be associated with a time duration between write accesses to a same bank group of the plurality of bank groups.

In some examples, to support communicating the respective first sets of data, the I/O controller 835 may be configured as or otherwise support a means for communicating the respective first set of data associated with a first bank of the plurality of banks via a first subset of the plurality of data channels. In some examples, to support communicating the respective first sets of data, the I/O controller 835 may be configured as or otherwise support a means for communicating the respective first set of data associated with a second bank of the plurality of banks via a second subset of the plurality of data channels concurrently with communicating the respective first set of data associated with the respective first bank.

In some examples, the first subset of the plurality of data channels may include a first portion of a first channel group and the second subset of the plurality of data channels may include a second portion of the first channel group.

In some examples, data channels of the first portion of the first channel group may be exclusive of data channels of the second portion of the first channel group.

In some examples, to support communicating the respective first sets of data, the I/O controller 835 may be configured as or otherwise support a means for communicating the respective first set of data associated with a third bank via a third subset of the plurality of data channels. In some examples, to support communicating the respective first sets of data, the I/O controller 835 may be configured as or otherwise support a means for communicating the respective first set of data associated with a fourth bank via a fourth subset of the plurality of data channels concurrently with communicating the respective first set of data associated with the third bank.

In some examples, a first cycle of communicating the respective first set of data associated with the third bank may occur subsequent to a first cycle of communicating the respective first set of data associated with the first bank.

In some examples, communicating the respective first sets of data of the first bank, the second bank, the third bank, and the fourth bank may at least partially overlap.

In some examples, the respective first sets of data may be communicated subsequent to receiving the plurality of access commands.

In some examples, the respective second sets of data may be communicated subsequent to communicating the respective first sets of data.

In some examples, to support communicating the respective first sets of data, the I/O controller 835 may be configured as or otherwise support a means for interleaving the respective first sets of data on the plurality of data channels.

In some examples, a time gap between abutting first sets of data of the respective first sets of data may be based on a burst length of the memory device and a difference between a gap between the respective access commands associated with the abutting first sets of data and the parameter.

In some examples, to support communicating the respective second sets of data, the I/O controller 835 may be configured as or otherwise support a means for interleaving the respective second sets of data on the plurality of data channels. In some examples, to support communicating the respective second sets of data, the I/O controller 835 may be configured as or otherwise support a means for communicating the interleaved second sets of data after the interleaved first sets of data.

Figure 9:
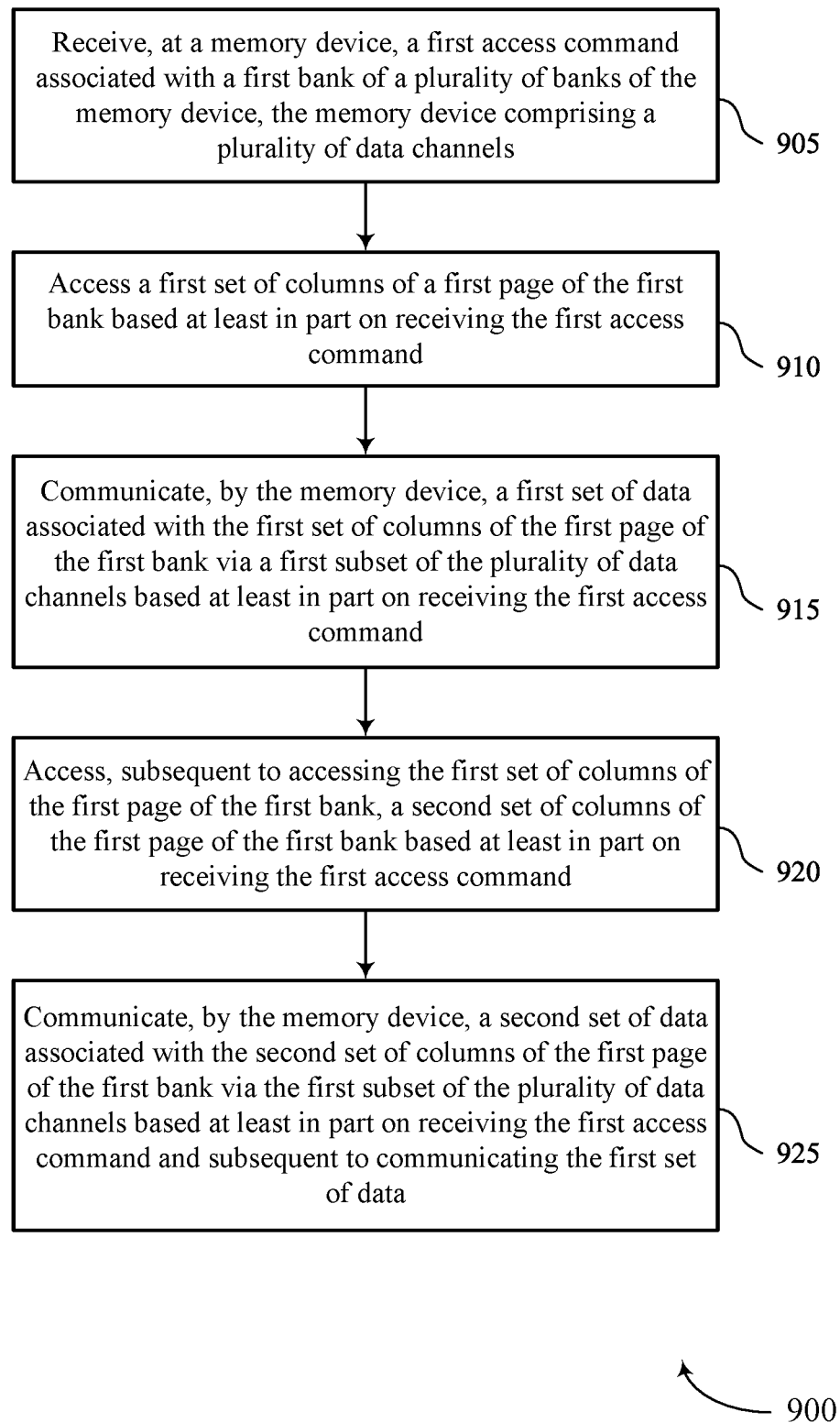
FIGS. 9 and 10 show flowcharts illustrating a method or methods that support memory operations across banks with multiple column access in accordance with examples as disclosed herein.

FIG. 9 shows a flowchart illustrating a method 900 that supports memory operations across banks with multiple column access in accordance with examples as disclosed herein. The operations of method 900 may be implemented by a memory device or its components as described herein. For example, the operations of method 900 may be performed by a memory device as described with reference to FIGS. 1 through 3. In some examples, a memory device may execute a set of instructions to control the functional elements of the device to perform the described functions. Additionally, or alternatively, the memory device may perform aspects of the described functions using special-purpose hardware.

At 905, the method may include receiving, at a memory device, a first access command associated with a first bank of a plurality of banks of the memory device, the memory device including a plurality of data channels. The operations of 905 may be performed in accordance with examples as disclosed herein. In some examples, aspects of the operations of 905 may be performed by a receiver 825 as described with reference to FIG. 8.

At 910, the method may include accessing a first set of columns of a first page of the first bank based at least in part on receiving the first access command. The operations of 910 may be performed in accordance with examples as disclosed herein. In some examples, aspects of the operations of 910 may be performed by a memory controller 830 as described with reference to FIG. 8.

At 915, the method may include communicating, by the memory device, a first set of data associated with the first set of columns of the first page of the first bank via a first subset of the plurality of data channels based at least in part on receiving the first access command. The operations of 915 may be performed in accordance with examples as disclosed herein. In some examples, aspects of the operations of 915 may be performed by an I/O controller 835 as described with reference to FIG. 8.

At 920, the method may include accessing, subsequent to accessing the first set of columns of the first page of the first bank, a second set of columns of the first page of the first bank based at least in part on receiving the first access command. The operations of 920 may be performed in accordance with examples as disclosed herein. In some examples, aspects of the operations of 920 may be performed by a memory controller 830 as described with reference to FIG. 8.

At 925, the method may include communicating, by the memory device, a second set of data associated with the second set of columns of the first page of the first bank via the first subset of the plurality of data channels based at least in part on receiving the first access command and subsequent to communicating the first set of data. The operations of 925 may be performed in accordance with examples as disclosed herein. In some examples, aspects of the operations of 925 may be performed by an I/O controller 835 as described with reference to FIG. 8.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory device, a first access command associated with a first bank of a plurality of banks of the memory device, the memory device including a plurality of data channels; accessing a first set of columns of a first page of the first bank based at least in part on receiving the first access command; communicating, by the memory device, a first set of data associated with the first set of columns of the first page of the first bank via a first subset of the plurality of data channels based at least in part on receiving the first access command; accessing, subsequent to accessing the first set of columns of the first page of the first bank, a second set of columns of the first page of the first bank based at least in part on receiving the first access command; and communicating, by the memory device, a second set of data associated with the second set of columns of the first page of the first bank via the first subset of the plurality of data channels based at least in part on receiving the first access command and subsequent to communicating the first set of data.

Aspect 2: The method, apparatus, or non-transitory computer-readable medium of aspect 1 where the memory device includes a plurality of bank groups, each bank group including a plurality of banks and a first bank group of the plurality of bank groups includes the first bank.

Aspect 3: The method, apparatus, or non-transitory computer-readable medium of any of aspects 1 through 2 where the first subset of the plurality of data channels includes a lower half of the plurality of data channels or an upper half of the plurality of data channels.

Aspect 4: The method, apparatus, or non-transitory computer-readable medium of any of aspects 1 through 3 where the plurality of data channels includes sixteen data channels and the first subset includes eight of the sixteen data channels.

Aspect 5: The method, apparatus, or non-transitory computer-readable medium of any of aspects 1 through 4 where accessing the second set of columns of the first page of the first bank includes operations, features, circuitry, logic, means, or instructions, or any combination thereof for generating an internal access command associated with the second set of columns of the first page of the first bank.

Aspect 6: The method, apparatus, or non-transitory computer-readable medium of any of aspects 1 through 5 where the first access command is a read access command or a write access command.

Aspect 7: The method, apparatus, or non-transitory computer-readable medium of any of aspects 1 through 6, further including operations, features, circuitry, logic, means, or instructions, or any combination thereof for receiving, at the memory device, a second access command associated with a second bank of the plurality of banks, the second access command received subsequent to receiving the first access command and prior to communicating the first set of data; accessing a third set of columns of a second page of the second bank based at least in part on receiving the second access command; communicating, by the memory device, a third set of data associated with the third set of columns of the second page of the second bank via a second subset of the plurality of data channels based at least in part on receiving the second access command, where communicating the third set of data is concurrent with communicating the first set of data; accessing, subsequent to accessing the third set of columns of the second page of the second bank, a fourth set of columns of the second page of the second bank based at least in part on receiving the second access command; and communicating, by the memory device, a fourth set of data associated with the fourth page of the second bank via the second subset of the plurality of data channels based at least in part on receiving the second access command where communicating the fourth set of data at least partially overlaps with communicating the second set of data.

Aspect 8: The method, apparatus, or non-transitory computer-readable medium of aspect 7 where the first bank is within a first bank group of a first plurality of bank groups and the second bank is within a second bank group of a second plurality of bank groups and bank groups of the first plurality of bank groups are mutually exclusive of bank groups of the second plurality of bank groups.

Aspect 9: The method, apparatus, or non-transitory computer-readable medium of any of aspects 7 through 8 where the second subset of the plurality of data channels is mutually exclusive of the first subset of the plurality of data channels.

Aspect 10: The method, apparatus, or non-transitory computer-readable medium of aspect 9 where the first subset of the plurality of data channels includes a lower half of the plurality of data channels or an upper half of the plurality of data channels and the second subset includes the other of the lower half of the plurality of data channels or the upper half of the plurality of data channels.

Aspect 11: The method, apparatus, or non-transitory computer-readable medium of any of aspects 7 through 10, further including operations, features, circuitry, logic, means, or instructions, or any combination thereof for where accessing the second set of columns of the first page of the first bank further includes generating a first internal access command associated with the second set of columns of the first page of the first bank and where accessing the fourth set of columns of the second page of the second bank further includes generating a second internal access command associated with the fourth set of columns of the second page of the second bank.

Aspect 12: The method, apparatus, or non-transitory computer-readable medium of aspect 11 where generating the first internal access command is performed concurrent with generating the second internal access command.

Figure 10:
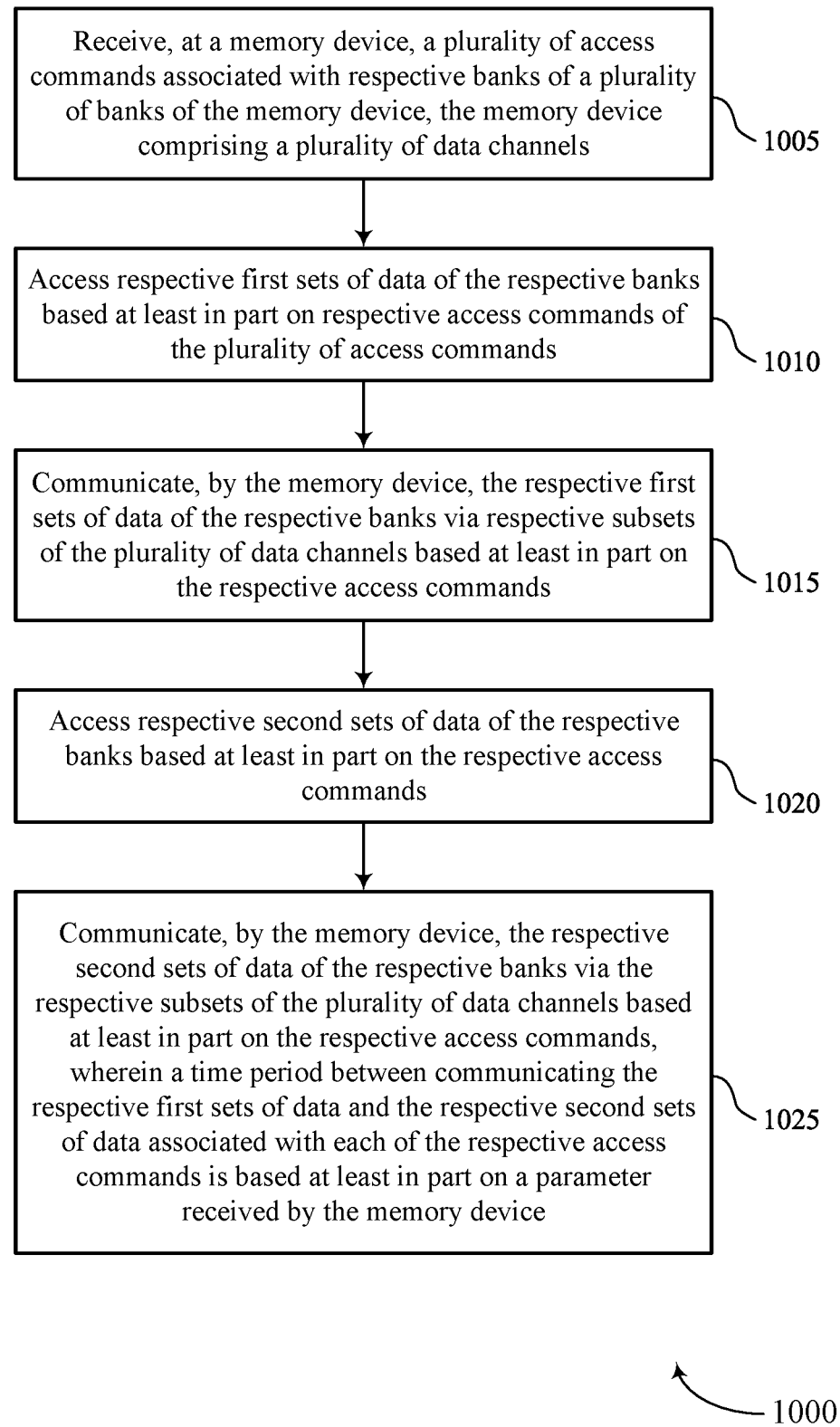

FIG. 10 shows a flowchart illustrating a method 1000 that supports memory operations across banks with multiple column access in accordance with examples as disclosed herein. The operations of method 1000 may be implemented by a memory device or its components as described herein. For example, the operations of method 1000 may be performed by a memory device as described with reference to FIGS. 1 through 3. In some examples, a memory device may execute a set of instructions to control the functional elements of the device to perform the described functions. Additionally, or alternatively, the memory device may perform aspects of the described functions using special-purpose hardware.

At 1005, the method may include receiving, at a memory device, a plurality of access commands associated with respective banks of a plurality of banks of the memory device, the memory device including a plurality of data channels. The operations of 1005 may be performed in accordance with examples as disclosed herein. In some examples, aspects of the operations of 1005 may be performed by a receiver 825 as described with reference to FIG. 8.

At 1010, the method may include accessing respective first sets of data of the respective banks based at least in part on respective access commands of the plurality of access commands. The operations of 1010 may be performed in accordance with examples as disclosed herein. In some examples, aspects of the operations of 1010 may be performed by a memory controller 830 as described with reference to FIG. 8.

At 1015, the method may include communicating, by the memory device, the respective first sets of data of the respective banks via respective subsets of the plurality of data channels based at least in part on the respective access commands. The operations of 1015 may be performed in accordance with examples as disclosed herein. In some examples, aspects of the operations of 1015 may be performed by an I/O controller 835 as described with reference to FIG. 8.

At 1020, the method may include accessing respective second sets of data of the respective banks based at least in part on the respective access commands. The operations of 1020 may be performed in accordance with examples as disclosed herein. In some examples, aspects of the operations of 1020 may be performed by a memory controller 830 as described with reference to FIG. 8.

At 1025, the method may include communicating, by the memory device, the respective second sets of data of the respective banks via the respective subsets of the plurality of data channels based at least in part on the respective access commands, where a time period between communicating the respective first sets of data and the respective second sets of data associated with each of the respective access commands is based at least in part on a parameter received by the memory device. The operations of 1025 may be performed in accordance with examples as disclosed herein. In some examples, aspects of the operations of 1025 may be performed by an I/O controller 835 as described with reference to FIG. 8.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for receiving, at a memory device, a plurality of access commands associated with respective banks of a plurality of banks of the memory device, the memory device including a plurality of data channels; accessing respective first sets of data of the respective banks based at least in part on respective access commands of the plurality of access commands; communicating, by the memory device, the respective first sets of data of the respective banks via respective subsets of the plurality of data channels based at least in part on the respective access commands; accessing respective second sets of data of the respective banks based at least in part on the respective access commands; and communicating, by the memory device, the respective second sets of data of the respective banks via the respective subsets of the plurality of data channels based at least in part on the respective access commands, where a time period between communicating the respective first sets of data and the respective second sets of data associated with each of the respective access commands is based at least in part on a parameter received by the memory device.

Aspect 14: The method, apparatus, or non-transitory computer-readable medium of aspect 13 where the parameter is based at least in part on a second parameter associated with a time period between accesses to different bank groups of a plurality of bank groups of the memory device.

Aspect 15: The method, apparatus, or non-transitory computer-readable medium of aspect 14 where the parameter is an integer multiple of the second parameter.

Aspect 16: The method, apparatus, or non-transitory computer-readable medium of aspect 15 where the integer multiple is determined as a ceiling of a third parameter associated with a time duration between accesses to a same bank group of the plurality of bank groups divided by the second parameter.

Aspect 17: The method, apparatus, or non-transitory computer-readable medium of aspect 16 where the plurality of access commands include write commands and the third parameter is associated with a time duration between write accesses to a same bank group of the plurality of bank groups.

Aspect 18: The method, apparatus, or non-transitory computer-readable medium of any of aspects 13 through 17 where communicating the respective first sets of data includes operations, features, circuitry, logic, means, or instructions, or any combination thereof for communicating the respective first set of data associated with a first bank of the plurality of banks via a first subset of the plurality of data channels and communicating the respective first set of data associated with a second bank of the plurality of banks via a second subset of the plurality of data channels concurrently with communicating the respective first set of data associated with the respective first bank.

Aspect 19: The method, apparatus, or non-transitory computer-readable medium of aspect 18 where the first subset of the plurality of data channels includes a first portion of a first channel group and the second subset of the plurality of data channels includes a second portion of the first channel group.

Aspect 20: The method, apparatus, or non-transitory computer-readable medium of aspect 19 where data channels of the first portion of the first channel group are exclusive of data channels of the second portion of the first channel group.

Aspect 21: The method, apparatus, or non-transitory computer-readable medium of any of aspects 18 through 20 where communicating the respective first sets of data includes operations, features, circuitry, logic, means, or instructions, or any combination thereof for communicating the respective first set of data associated with a third bank via a third subset of the plurality of data channels and communicating the respective first set of data associated with a fourth bank via a fourth subset of the plurality of data channels concurrently with communicating the respective first set of data associated with the third bank.

Aspect 22: The method, apparatus, or non-transitory computer-readable medium of aspect 21 where a first cycle of communicating the respective first set of data associated with the third bank occurs subsequent to a first cycle of communicating the respective first set of data associated with the first bank.

Aspect 23: The method, apparatus, or non-transitory computer-readable medium of any of aspects 21 through 22 where communicating the respective first sets of data of the first bank, the second bank, the third bank, and the fourth bank at least partially overlap.

Aspect 24: The method, apparatus, or non-transitory computer-readable medium of any of aspects 13 through 23 where the respective first sets of data are communicated subsequent to receiving the plurality of access commands.

Aspect 25: The method, apparatus, or non-transitory computer-readable medium of any of aspects 13 through 24 where the respective second sets of data are communicated subsequent to communicating the respective first sets of data.

Aspect 26: The method, apparatus, or non-transitory computer-readable medium of any of aspects 13 through 25 where communicating the respective first sets of data includes operations, features, circuitry, logic, means, or instructions, or any combination thereof for interleaving the respective first sets of data on the plurality of data channels.

Aspect 27: The method, apparatus, or non-transitory computer-readable medium of aspect 26 where a time gap between abutting first sets of data of the respective first sets of data is based on a burst length of the memory device and a difference between a gap between the respective access commands associated with the abutting first sets of data and the parameter.

Aspect 28: The method, apparatus, or non-transitory computer-readable medium of any of aspects 26 through 27 where communicating the respective second sets of data includes operations, features, circuitry, logic, means, or instructions, or any combination thereof for interleaving the respective second sets of data on the plurality of data channels and communicating the interleaved second sets of data after the interleaved first sets of data.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving, at a memory device, a first access command associated with a first bank of a plurality of banks of the memory device, the memory device comprising a plurality of data channels;
    accessing a first set of columns of a first page of the first bank based at least in part on receiving the first access command;
    communicating, by the memory device to a device external to the memory device, a first set of data associated with the first set of columns of the first page of the first bank via a first subset of the plurality of data channels based at least in part on receiving the first access command;
    accessing, subsequent to accessing the first set of columns of the first page of the first bank, a second set of columns of the first page of the first bank based at least in part on receiving the first access command; and
    communicating, by the memory device to the device external to the memory device, a second set of data associated with the second set of columns of the first page of the first bank via the first subset of the plurality of data channels based at least in part on receiving the first access command and subsequent to communicating the first set of data.

2. The method of claim 1, wherein:
    the memory device comprises a plurality of bank groups, each bank group comprising a plurality of banks, and
    a first bank group of the plurality of bank groups comprises the first bank.

3. The method of claim 1, wherein the first subset of the plurality of data channels comprises a lower half of the plurality of data channels or an upper half of the plurality of data channels.

4. The method of claim 1, wherein the plurality of data channels comprises sixteen data channels and the first subset comprises eight of the sixteen data channels.

5. The method of claim 1, wherein accessing the second set of columns of the first page of the first bank comprises:

generating an internal access command associated with the second set of columns of the first page of the first bank.

6. The method of claim 1, wherein the first access command is a read access command or a write access command.

7. The method of claim 1, further comprising:
receiving, at the memory device, a second access command associated with a second bank of the plurality of banks, the second access command received subsequent to receiving the first access command and prior to communicating the first set of data;
accessing a third set of columns of a second page of the second bank based at least in part on receiving the second access command;
communicating, by the memory device, a third set of data associated with the third set of columns of the second page of the second bank via a second subset of the plurality of data channels based at least in part on receiving the second access command, wherein communicating the third set of data is concurrent with communicating the first set of data;
accessing, subsequent to accessing the third set of columns of the second page of the second bank, a fourth set of columns of the second page of the second bank based at least in part on receiving the second access command; and
communicating, by the memory device, a fourth set of data associated with the fourth set of columns of the second page of the second bank via the second subset of the plurality of data channels based at least in part on receiving the second access command, wherein communicating the fourth set of data at least partially overlaps with communicating the second set of data.

8. The method of claim 7, wherein:
the first bank is within a first bank group of a first plurality of bank groups and the second bank is within a second bank group of a second plurality of bank groups, and
bank groups of the first plurality of bank groups are mutually exclusive of bank groups of the second plurality of bank groups.

9. The method of claim 7, wherein the second subset of the plurality of data channels is mutually exclusive of the first subset of the plurality of data channels.

10. The method of claim 9, wherein the first subset of the plurality of data channels comprises a lower half of the plurality of data channels or an upper half of the plurality of data channels and the second subset comprises the other of the lower half of the plurality of data channels or the upper half of the plurality of data channels.

11. The method of claim 7, further comprising:
wherein accessing the second set of columns of the first page of the first bank further comprises generating a first internal access command associated with the second set of columns of the first page of the first bank; and
wherein accessing the fourth set of columns of the second page of the second bank further comprises generating a second internal access command associated with the fourth set of columns of the second page of the second bank.

12. The method of claim 11, wherein generating the first internal access command is performed concurrent with generating the second internal access command.

13. A method, comprising:
receiving, at a memory device, a plurality of access commands associated with respective banks of a plurality of banks of the memory device, the memory device comprising a plurality of data channels;
accessing respective first sets of data of the respective banks based at least in part on respective access commands of the plurality of access commands;
communicating, by the memory device, the respective first sets of data of the respective banks via respective subsets of the plurality of data channels based at least in part on the respective access commands;
accessing respective second sets of data of the respective banks based at least in part on the respective access commands; and
communicating, by the memory device, the respective second sets of data of the respective banks via the respective subsets of the plurality of data channels based at least in part on the respective access commands, wherein a time period between communicating the respective first sets of data and the respective second sets of data associated with each of the respective access commands is based at least in part on a parameter received by the memory device.

14. The method of claim 13, wherein the parameter is based at least in part on a second parameter associated with a time period between accesses to different bank groups of a plurality of bank groups of the memory device.

15. The method of claim 14, wherein the parameter is an integer multiple of the second parameter.

16. The method of claim 15, wherein the integer multiple is determined as a ceiling of a third parameter associated with a time duration between accesses to a same bank group of the plurality of bank groups divided by the second parameter.

17. The method of claim 16, wherein the plurality of access commands comprise write commands and the third parameter is associated with a time duration between write accesses to a same bank group of the plurality of bank groups.

18. The method of claim 13, wherein communicating the respective first sets of data comprises:
communicating the respective first set of data associated with a first bank of the plurality of banks via a first subset of the plurality of data channels; and
communicating the respective first set of data associated with a second bank of the plurality of banks via a second subset of the plurality of data channels concurrently with communicating the respective first set of data associated with the respective first bank.

19. The method of claim 18, wherein the first subset of the plurality of data channels comprises a first portion of a first channel group and the second subset of the plurality of data channels comprises a second portion of the first channel group.

20. The method of claim 19, wherein data channels of the first portion of the first channel group are exclusive of data channels of the second portion of the first channel group.

21. The method of claim 18, wherein communicating the respective first sets of data comprises:
communicating the respective first set of data associated with a third bank via a third subset of the plurality of data channels; and
communicating the respective first set of data associated with a fourth bank via a fourth subset of the plurality of data channels concurrently with communicating the respective first set of data associated with the third bank.

22. The method of claim 21, wherein a first cycle of communicating the respective first set of data associated with the third bank occurs subsequent to a first cycle of communicating the respective first set of data associated with the first bank.

23. The method of claim 21, wherein communicating the respective first sets of data of the first bank, the second bank, the third bank, and the fourth bank at least partially overlap.

24. The method of claim 13, wherein the respective first sets of data are communicated subsequent to receiving the plurality of access commands.

25. The method of claim 13, wherein the respective second sets of data are communicated subsequent to communicating the respective first sets of data.

26. The method of claim 13, wherein communicating the respective first sets of data comprises:
   interleaving the respective first sets of data on the plurality of data channels.

27. The method of claim 26, wherein a time gap between abutting first sets of data of the respective first sets of data is based on a burst length of the memory device and a difference between a gap between the respective access commands associated with the abutting first sets of data and the parameter.

28. The method of claim 26, wherein communicating the respective second sets of data comprises:
   interleaving the respective second sets of data on the plurality of data channels; and
   communicating the interleaved second sets of data after the interleaved first sets of data.

* * * * *